US009368623B2

(12) United States Patent
Xue et al.

(10) Patent No.: US 9,368,623 B2
(45) Date of Patent: Jun. 14, 2016

(54) HIGH VOLTAGE DEVICE FABRICATED USING LOW-VOLTAGE PROCESSES

(71) Applicant: MICROSEMI SOC CORPORATION, San Jose, CA (US)

(72) Inventors: Fengliang Xue, San Jose, CA (US); Fethi Dhaoui, Mountain House, CA (US); John McCollum, San Jose, CA (US)

(73) Assignee: Microsemi SoC Corporation, San Jose, CA (US)

( * ) Notice: Subject to any disclaimer, the term of this patent is extended or adjusted under 35 U.S.C. 154(b) by 0 days.

(21) Appl. No.: 14/547,336

(22) Filed: Nov. 19, 2014

(65) Prior Publication Data

US 2015/0137233 A1     May 21, 2015

Related U.S. Application Data

(60) Provisional application No. 61/907,235, filed on Nov. 21, 2013.

(51) Int. Cl.
| | |
|---|---|
| *H01L 29/78* | (2006.01) |
| *H01L 29/66* | (2006.01) |
| *H01L 21/336* | (2006.01) |
| *H01L 21/02* | (2006.01) |
| *H01L 29/06* | (2006.01) |
| *H01L 29/08* | (2006.01) |

(52) U.S. Cl.
CPC ........ *H01L 29/7833* (2013.01); *H01L 29/0653* (2013.01); *H01L 29/0847* (2013.01); *H01L 29/665* (2013.01)

(58) Field of Classification Search
CPC ............ H01L 29/7833; H01L 29/0653; H01L 21/265; H01L 2029/7863
USPC .......................................... 257/344; 438/294
See application file for complete search history.

(56) References Cited

U.S. PATENT DOCUMENTS

| 6,110,782 A | 8/2000 | Chu et al. |
| 7,022,560 B2 | 4/2006 | Olofsson |
| 7,667,268 B2 * | 2/2010 | Disney ................ H01L 29/0638 257/335 |

(Continued)

OTHER PUBLICATIONS

United States Patent and Trademark Office, International Search Report issued in PCT/US2014/66448, Feb. 5, 2015, 2 pages.

(Continued)

*Primary Examiner* — Moazzam Hossain
(74) *Attorney, Agent, or Firm* — Leech Tishman Fuscaldo & Lampl; Kenneth D'Alessandro, Esq.

(57) ABSTRACT

A high-voltage transistor includes an active region including a diffused region of a first conductivity type defined by inner edges of a border of shallow trench isolation. A gate having side edges and end edges is disposed over the active region. Spaced apart source and drain regions of a second conductivity type opposite the first conductivity type are disposed in the active region outwardly with respect to the side edges of the gate. Lightly-doped regions of the second conductivity type more lightly-doped than the source and drain regions surround the source and drain regions and extend inwardly between the source and drain regions towards the gate to define a channel, and outwardly towards all of the inner edges of the shallow trench isolation. Outer edges of the lightly-doped region from at least the drain region are spaced apart from the inner edges of the shallow trench isolation.

19 Claims, 3 Drawing Sheets

(56) References Cited

U.S. PATENT DOCUMENTS

| | | | | |
|---|---|---|---|---|
| 8,552,511 B2* | 10/2013 | Shima | ............ | H01L 29/665 257/335 |
| 2002/0094642 A1* | 7/2002 | Kikuchi | ............ | H01L 21/26586 438/268 |
| 2006/0286757 A1* | 12/2006 | Power | ............ | H01L 29/7834 438/305 |
| 2007/0200185 A1* | 8/2007 | Hirase | ............ | H01L 29/4983 257/410 |
| 2010/0164018 A1* | 7/2010 | Lee | ............ | H01L 29/0847 257/408 |
| 2011/0108917 A1* | 5/2011 | Shima | ............ | H01L 29/0847 257/344 |
| 2011/0221000 A1* | 9/2011 | Shima | ............ | H01L 21/823412 257/344 |
| 2013/0181287 A1* | 7/2013 | Zhang | ............ | H01L 21/26506 257/335 |
| 2013/0189820 A1* | 7/2013 | Shima | ............ | H01L 29/0847 438/294 |
| 2015/0108588 A1* | 4/2015 | Salzman | ............ | H01L 27/092 257/409 |

OTHER PUBLICATIONS

United States Patent and Trademark Office, Written Opinion issued in PCT/US2014/66448, Feb. 5, 2015, 4 pages.

\* cited by examiner

- - - - - P-Well
- - - - Gate
— - — LDD
— - - — n+
▨ SB

HIGH VOLTAGE DEVICE FABRICATED USING LOW-VOLTAGE PROCESSES

CROSS-REFERENCE TO RELATED APPLICATIONS

This application claims the benefit of U.S. Provisional Patent Application No. 61/907,235 for "High Voltage Device Fabricated Using Low-Voltage Processes" filed Nov. 21, 2013, the contents of which are incorporated in this disclosure by reference in their entirety.

BACKGROUND OF THE INVENTION

Programming Silicon-Oxide-Nitride-Oxide-Silicon (SONOS) nonvolatile memory requires medium high or high programming voltages in relation to other voltages used on the device. The devices used to provide these programming voltages should have sufficiently high junction breakdown voltage and are usually fabricated using gate oxide layers thicker than standard I/O devices to increase gate breakdown voltage. Incorporating the formation of these devices into existing complementary metal-oxide-semiconductor (CMOS) fabrication processes usually involves additional masks and process steps that are not part of conventional CMOS fabrication processes.

More particularly, to achieve sufficient gate and junction breakdown voltages, existing high (larger than 10V) or medium high (5 to 10V) voltage devices use customized doping profiles, especially at the edges of shallow trench isolation (STI) regions defining the active areas of these devices, as well as the aforementioned thicker gate, all of which contributes to lower yield.

SUMMARY OF THE INVENTION

According to one aspect of the present invention, a high voltage (5 to 10V) transistor is disclosed that can be fabricated using conventional CMOS processes, without the need to provide additional masking and other process steps. The transistor includes lightly-doped regions surrounding at least the drain region and optionally the source region. The lightly-doped regions extend outwardly towards edges of an active area defined by inner edges of shallow trench isolation (STI), however outer edges of the lightly-doped regions are spaced apart from the inner edges of the shallow trench isolation.

DESCRIPTION OF THE INVENTION

Persons of ordinary skill in the art will realize that the following description of the present invention is illustrative only and not in any way limiting. Other embodiments of the invention will readily suggest themselves to such skilled persons. The below embodiments are particularly described in relation to an n-channel device formed in P-well, it being understood that a p-channel device formed in an N-well is similarly formed.

Figure 1:
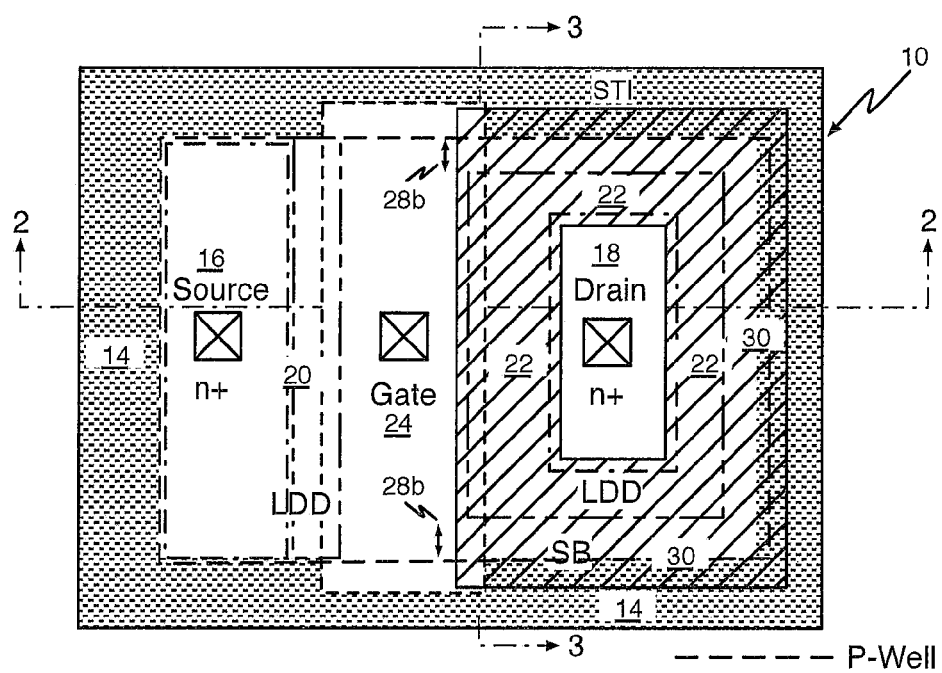
FIG. 1 is a top view of an illustrative layout of a high-voltage transistor in accordance with one aspect of the present invention.
Figure 2:
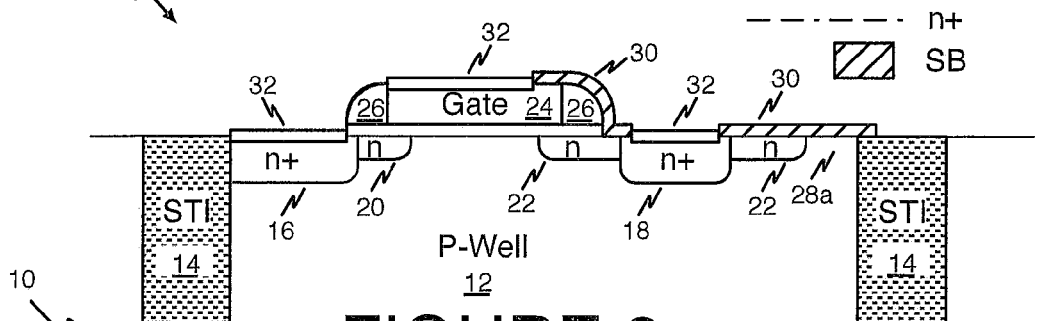
FIG. 2 is a cross sectional view of the layout of a high-voltage transistor of FIG. 1 taken along lines 2-2 in a direction across the width of the channel.
Figure 3:
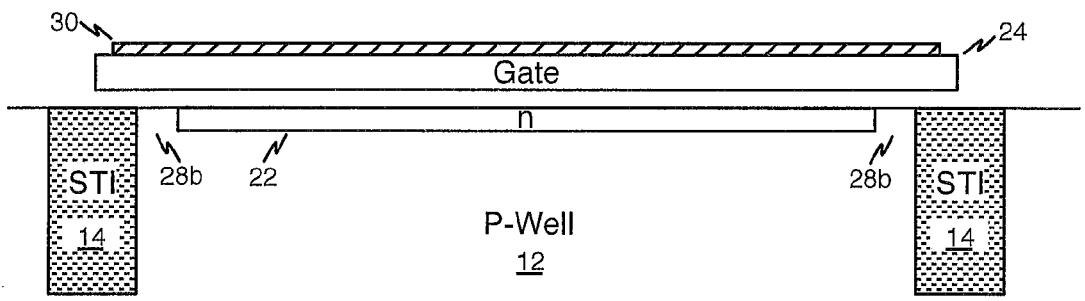
FIG. 3 is a cross sectional view of the layout of a high-voltage transistor of FIG. 1 taken along lines 3-3 near the drain edge of the gate in a direction along the drain edge of the channel.

Referring to FIGS. 1 through 3, top and cross sectional views show an illustrative layout of a high-voltage transistor 10 fabricated in accordance with one aspect of the present invention in which the drain side of the transistor is pulled back from the diffusion edge. FIG. 1 is a top view, FIG. 2 is a cross sectional view taken along lines 2-2 of FIG. 1 in a direction across the width of the channel, and FIG. 3 is a cross sectional view taken along lines 3-3 of FIG. 1 near the drain edge of the gate in a direction along the drain edge of the channel.

The active area of the high-voltage transistor 10 is a p-well region 12 that lies within shallow trench isolation region 14. N+ source region 16 and N+ drain region 18 are formed in p-well 12. Lightly-doped drain (LDD) regions 20 and 22 surround source and drain regions 16 and 18, respectively, and define a channel in between the source and drain. Gate 24 is disposed above and insulated from the substrate over the channel. Spacers 26 are formed on the side edges of the gate to facilitate formation of the LDD regions 20 and 22 by blocking the higher source/drain implant at the gate edges as is known in the art. In a typical embodiment, the LDD doping level is between about 5e16 and 5e17 cm-3, and the source/drain implant doping is between about 1e19 and 1e20 cm-3. The spacers are shown in FIG. 2 and are not indicated in FIG. 1 to avoid overcomplicating the drawing figure.

As shown in FIG. 2, the edge of the LDD region 22 in the p-well diffusion 12 extending outwardly (towards the right side of FIG. 2) from the drain 18 of transistor 10 is spaced inwardly from the inner edge of the STI region in the present invention as shown at reference numeral 28a. In a typical embodiment, the drain LDD region 22 surrounding the drain region 18 is spaced inwardly from inner edge of the STI region 14 by between about 100 nm and 500 nm. The diffusion edge is where devices usually break down first due to the presence of the highest electric fields in these regions. This inward spacing is also performed at the edges of the channel width, i.e., near the end edges of the gate 24 as indicated by arrows 28b in FIG. 1 and by reference numerals 28b in FIG. 3. As may be seen from an examination of both FIG. 1 and FIG. 3, the ends of the gate 24 extend beyond the outer edges of the LDD regions at 28b and even into the area above the STI boundary of the transistor active area.

Pulling back the outer portions of the LDD region 22 changes the potential contour around the drain 18 and significantly lowers the electric field at the edge of the STI region 14. With this, drain junction breakdown voltage increases significantly, and will easily meet a voltage breakdown requirement of about 8 volts or higher. This inward spacing is important on the drain side of the devices where the highest voltages will be found during normal device operation. This decreases mask symmetry somewhat. An individual designer will weigh this tradeoff at design time. While persons of ordinary skill in the art will realize that what is a "high voltage" will scale with shrinking device sizes, the principles of the present invention will still be valid.

To further improve junction breakdown, a salicide block layer 30 is introduced at least at the drain side so that only silicon in the vicinity of the source, drain, and gate contacts is salicided (i.e., converted to a metal salicide). Persons of ordinary skill in the art will appreciate that, for simplicity, the top view of FIG. 1 shows a single contact to each of the source and drain regions 16 and 18, and that multiple contacts may be employed in an actual integrated circuit fabricated according to the teachings of the present invention. Metal salicide regions 32 are shown in FIG. 2 in contact apertures at the upper surfaces of the source 16, drain 18, and gate regions 24 as is known in the art. Because the outer edges of the diffusions (p-well 12) are covered by the salicide block layer 30 that extends over the inner edges of STI regions 12, they have not been converted to metal salicide. Consequently, they have a lower electric field and leakage, as well as much reduced joule heat generated at the drain corners. The robustness of the transistor is thereby much improved.

Figure 4:
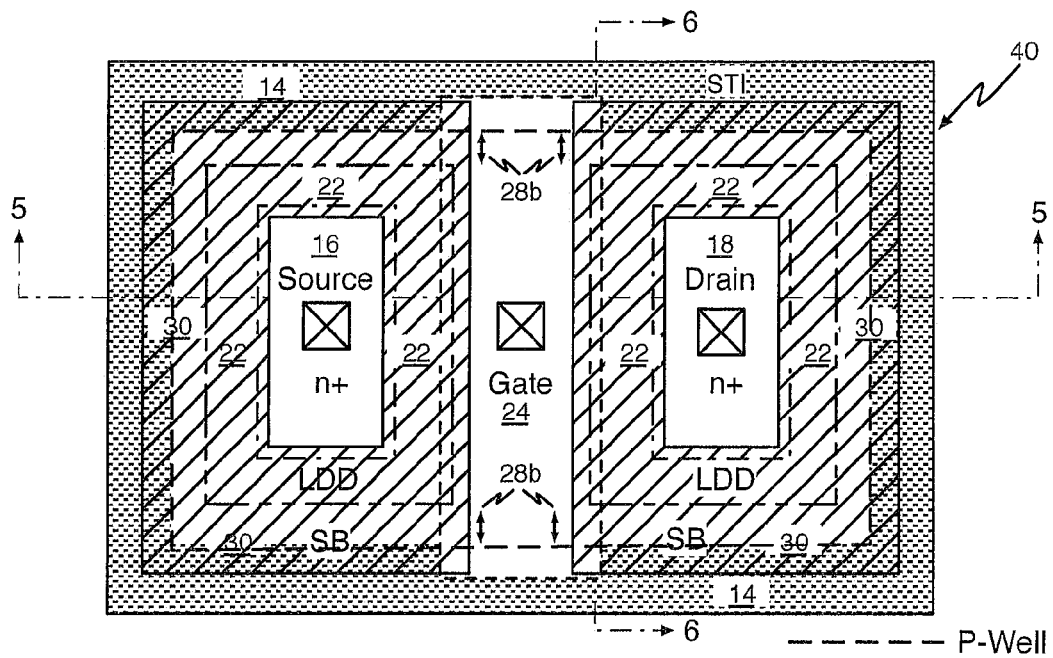
FIG. 4 is a top view of an illustrative layout of a high-voltage transistor in accordance with another aspect of the present invention.
Figure 5:
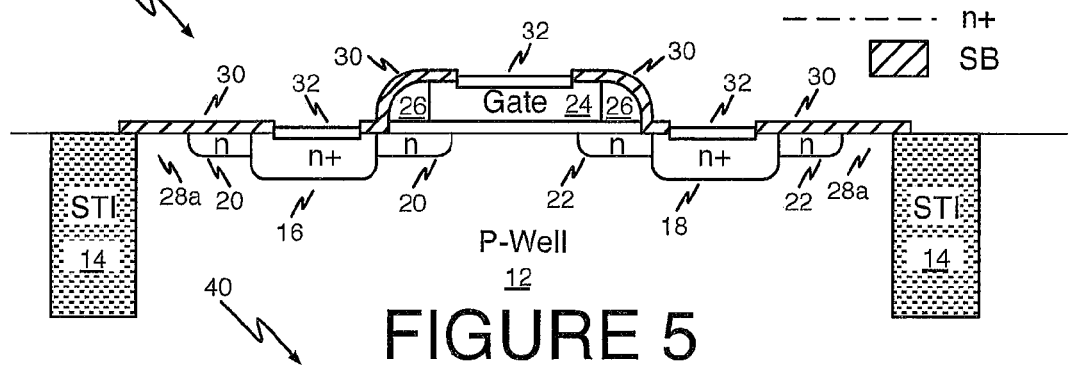
FIG. 5 is a cross sectional view of the layout of a high-voltage transistor of FIG. 4 taken along lines 5-5 in a direction across the width of the channel.
Figure 6:
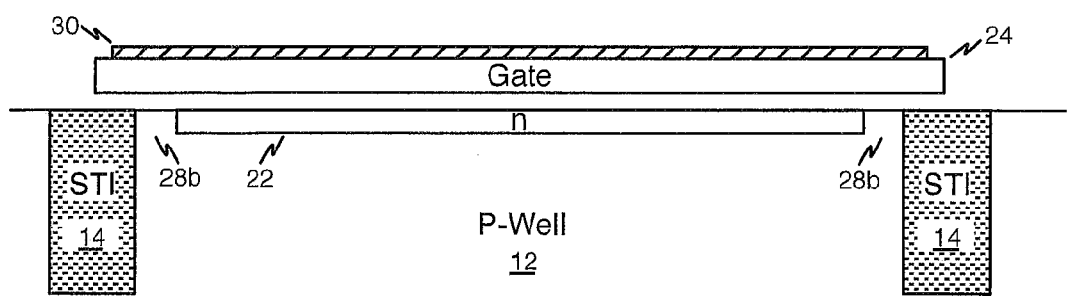
FIG. 6 is a cross sectional view of the layout of a high-voltage transistor of FIG. 4 taken along lines 6-6 near the drain edge of the gate in a direction along the drain edge of the channel.

Referring also to FIGS. 4 through 6, top and cross sectional views show an illustrative layout of a high-voltage transistor 40 fabricated in accordance with another aspect of the present invention in which both the drain side and the source side of the transistor are pulled back from the diffusion edge. FIG. 4 is a top view, FIG. 5 is a cross sectional view taken along lines 5-5 of FIG. 4 in a direction across the width of the channel, and FIG. 6 is a cross sectional view taken along lines 6-6 of FIG. 4 near the drain side of the gate in a direction along the drain edge of the channel.

Transistor 40 of FIGS. 4 through 6 is similar to transistor 10 of FIGS. 1 through 3. Elements of transistor 40 that are the same as elements of transistor 10 of FIGS. 1 through 3 are designated by the same reference numerals used to identify corresponding elements in FIGS. 4 through 6.

The active area of the high-voltage transistor 40 is a p-well region 12 that lies within shallow trench isolation region 14. N+ source region 16 and N+ drain region 18 are formed in p-well 12. Lightly-doped drain (LDD) regions 20 and 22 surround source and drain regions 16 and 18 and define a channel in between the source and drain. Gate 24 is disposed above and insulated from the substrate over the channel. Spacers 26 are formed on the edges of the gate to facilitate formation of the LDD regions 20 and 22 by blocking the higher source/drain implant at the gate edges as is known in the art. In an exemplary embodiment, the LDD doping level is between about 5e16 and 5e17 cm−3, and the source/drain implant doping is between about 1e19 and 1e20 cm−3. The spacers are shown in FIG. 5 and are not indicated in FIG. 4 to avoid overcomplicating the drawing figure.

As shown in FIGS. 5 and 6, the edges of the LDD regions 20 and 22 in the p-well diffusion 12 that extend outwardly towards the STI region 14 from both the drain 18 (towards the right side of FIG. 5) and the source 16 (to the left side of FIG. 5) of transistor 40, respectively, are spaced inwardly from the inner edges of the STI regions 14 in the present invention. In an exemplary embodiment, the LDD regions 20 and 22 are spaced inwardly from the inner edge of the STI 14 by between about 100 nm and 500 nm. In the embodiment of the invention depicted in FIGS. 4 through 6, this inward spacing is performed at both the edge of the LDD region 22 at the drain side and the source side of the transistor 10 as indicated at reference numerals 28a, as illustrated in FIG. 5, and also, as in the embodiment depicted in FIGS. 1 through 3, at the edges of the channel near the ends of the gate 24 as indicated by arrows 28b in FIG. 4 and reference numeral 28b in FIG. 6. As may be seen from an examination of both FIG. 4 and FIG. 6, the ends of the gate 24 extend beyond the outer edges of the outer LDD regions at 28b and even into the area above the STI boundary of the transistor active area.

Pulling back drain N+ implant and the outer portions of the LDD regions 22 from STI region 14 changes the potential contour around the drain 18 and significantly lowers the electric field at the edge of the STI region 14. Pulling back the outer portions of the LDD regions 20 from STI region 40 changes the potential contour around the source 20 and significantly lowers the electric field at the edge of the STI region 14. With this, drain junction breakdown voltage increases significantly, and will easily meet medium high voltage requirement of about 9 volts. As noted, this inward spacing of the LDD regions from the edges of the STI region 14 is important on the drain side of the devices where the highest voltages will be found during normal device operation, but in this embodiment of the present invention, the inward spacing is also provided at the source side as shown in FIGS. 4 through 6. This allows more symmetrical masks to be used, but the pullback of the LDD region 20 at the source 16 will increase the source impedance somewhat. An individual designer will weigh these tradeoffs at design time.

To further improve junction breakdown, a salicide block layer 30 is introduced at least at the drain side so that only silicon in the vicinity of the contacts, including the gate contact 32, is salicided (i.e., converted to a metal salicide). As shown in FIG. 5, the salicide block layer 30 may be similarly introduced at the source side for symmetry. Persons of ordinary skill in the art will appreciate that, for simplicity, the top view of FIG. 4 shows a single contact to each of the source and drain regions 16 and 18, and that multiple contacts may be employed in an actual integrated circuit fabricated according to the teachings of the present invention. Metal salicide regions 32 are shown in FIG. 5 in contact apertures at the upper surfaces of the source, drain, and gate regions as is known in the art. Because the outer edges of the diffusions (p-well 12) are covered by the salicide block layer 30 that extends over the inner edges of STI regions 12, they have not been converted to metal salicide. Consequently, they have a lower electric field and leakage, as well as much reduced joule heat generated at the drain corners. The robustness of the transistor is thereby much improved.

Figure 7:
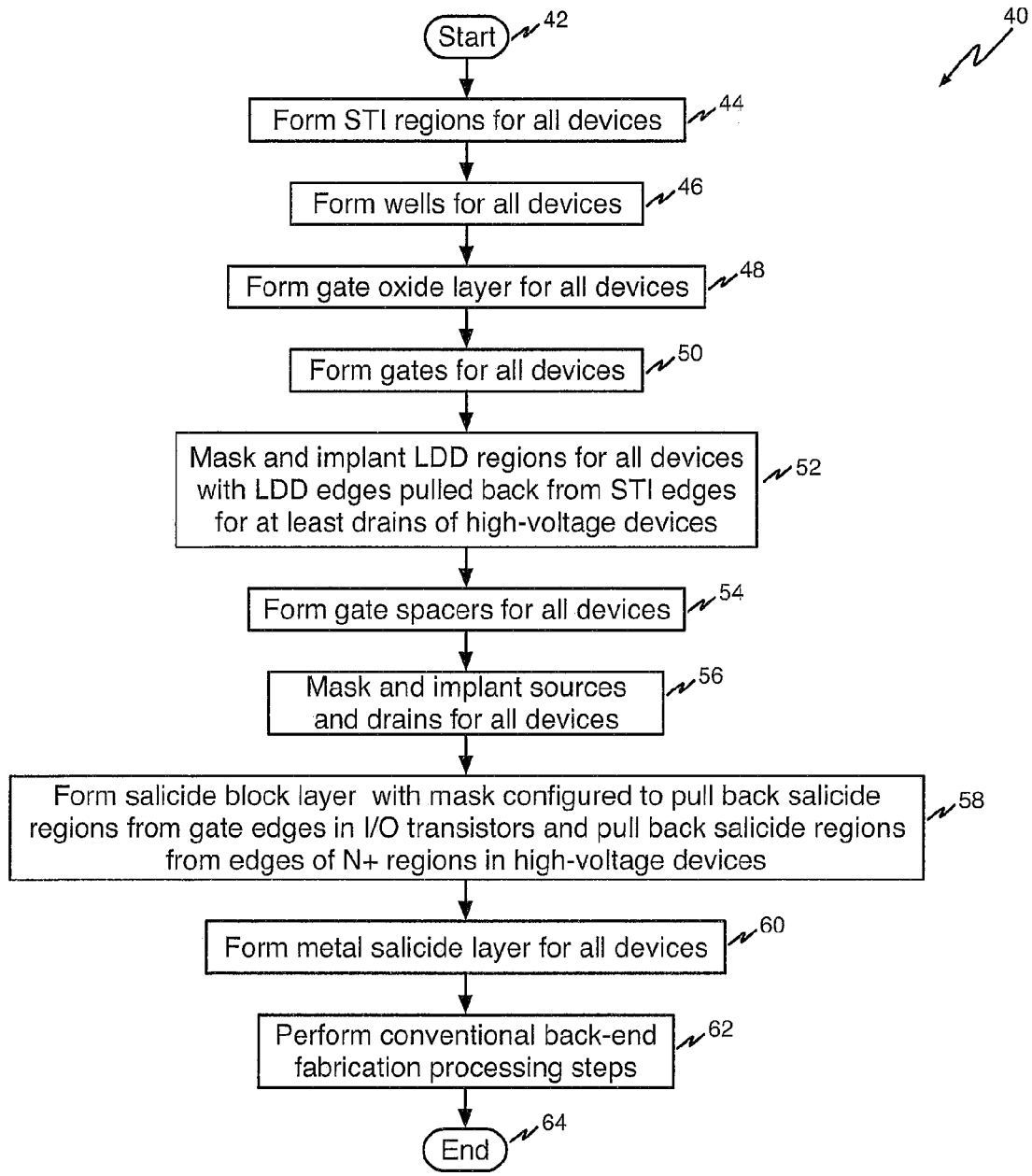
FIG. 7 is a flow chart showing an exemplary fabrication process for the high-voltage transistors of the present invention.

The high-voltage transistors of the present invention can be fabricated using a conventional low voltage logic CMOS process flow. Referring now to FIG. 7, an exemplary process 40 for fabricating the high-voltage transistors of the present invention is shown. The process starts art reference numeral 42. At reference numeral 44, STI regions are defined and formed using conventional photolithography and etching steps. Next, the bottoms of the trenches are doped with channel-stop implants using conventional implanting steps. The trenches are then filled with a dielectric material using conventional deposition techniques.

At reference numeral 46, the p-wells and n-wells for all of the devices are formed using conventional lithography and dopant diffusion techniques. Persons of ordinary skill in the art will appreciate that, in conventional CMOS processes, the well formation steps may be performed either before or after the STI formation steps.

Next, as shown at reference numeral 48, a gate oxide layer for all of the transistor devices is grown or deposited using conventional techniques. At reference numeral 50, a layer of polysilicon is deposited and defined to form the gates for all of the transistor devices on the integrated circuit, also using known techniques.

At reference numeral 52, the LDD regions for all devices on the integrated circuit are formed. A mask for the lightly-doped-drain (LDD) regions is applied using conventional photolithography steps. The LDD mask is already used in a conventional CMOS process. The mask geometry is altered to accommodate the features of the invention that are shown in FIG. 16, particularly the pull back from the formed STI region of the drain LDD, and optionally the pull back from the formed STI region of the source LDD. The LDD regions are then implanted using conventional ion implantation steps.

After the LDD regions have been formed, at reference numeral 54 gate spacers are formed at the gate edges as is known in the art. At reference numeral 56 an N+ mask is then applied using conventional photolithography steps. The N+ mask is already used in a conventional CMOS process to form all of the n-channel transistors in the circuit. The source and drain regions for all devices are then implanted using conventional implantation steps.

At reference numeral 58, a salicide block layer is then defined and formed using lithography, deposition, and etching steps as is known in the art. This process sequence is already present in a conventional CMOS process employing salicided contacts to form a salicide block layer configured to pull back salicide regions from gate edges in I/O transistors to provide electrostatic discharge protection. In accordance with one aspect of the present invention, the existing mask for this process is modified to add the features of the salicide block layer of the present invention so that the oxide etch process for the salicide apertures incorporates the geometry of the salicide block layer taught herein, in particular that only silicon in the N+ regions and gate regions is salicided, and that salicide is not formed at the edges of the active region at the inner edges of the STI regions.

At reference numeral 60, the metal layer for the salicide is then deposited and rapidly annealed to form salicide regions in the apertures of the salicide mask as is known in the art. The portions of the metal layer overlaying the salicide mask that have not been converted to metal salicides are then removed as is known in the art, for example by a selective metal etching step.

At reference numeral 62, the normal back-end process steps are then performed, including depositing dielectrics, formation and definition of one or more metal interconnect layers and connection vias, and device passivation. The process ends at reference numeral 64.

From the above process description, persons of ordinary skill in the art will readily appreciate that the high-voltage transistor of the present invention can be fabricated without altering existing CMOS fabrication processes. The processes accommodate the high-voltage transistors of the present invention by altering the geometry of several of the masks used in the already existing mask set for the process in order to accommodate the geometric features of the invention disclosed herein.

The present invention provides a significantly simpler fabrication process as compared to the conventional method, and a significant total footprint reduction as compared to other possible solutions such as source/drain extension MOS devices. The new device is fully compatible with existing process, and readily scalable in channel width and length, which is critical for efficient circuit design.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

The invention claimed is:

1. A high-voltage transistor comprising:
    an active region including a diffused region of a first conductivity type defined by inner edges of a border of shallow trench isolation;
    a gate having side edges and end edges disposed over and insulated from the active region;
    spaced apart source and drain regions of a second conductivity type opposite the first conductivity type disposed in the active region outwardly with respect to the side edges of the gate;
    first lightly-doped regions of the second conductivity type more lightly doped than the source and drain regions, the first lightly-doped regions extending inwardly between the source and drain regions towards the gate to define a channel under the gate;
    second lightly-doped regions of the second conductivity type more lightly doped than the source and drain regions that extend outwardly from at least the drain region towards the inner edges of the shallow trench isolation, outer edges of the second lightly doped regions being spaced apart from the inner edges of the shallow trench isolation throughout the entire volume of the active region by portions of the active region that extend laterally from the outer edges of the second lightly-doped regions to the inner edges of the shallow trench isolation.

2. The high-voltage transistor of claim 1 wherein the outer edges of the lightly-doped regions are spaced apart from the inner edges of the shallow trench isolation by between about 100 nm and about 500 nm.

3. The high-voltage transistor of claim 1 further comprising:
    a salicide block layer disposed over the active region and extending at least to the inner edges of the shallow trench isolation, the salicide block layer having contact apertures formed therein extending to the source and drain regions and to the gate; and
    metal salicide layers formed in the contact apertures at the source and drain regions and the gate.

4. The high-voltage transistor of claim 3 wherein the salicide block layer extends over the shallow trench isolation.

5. The high-voltage transistor of claim 1 wherein the lightly doped regions are doped to a level of between about 5e16 and 5e17 cm-3.

6. The high-voltage transistor of claim 1 wherein the source and drain regions are doped to a level of between about 1e19 and 1e20 cm-3.

7. The high-voltage transistor of claim 1 wherein the second lightly-doped regions extend outwardly from both the source and drain regions towards the inner edges of the shallow trench isolation, outer edges of the second lightly doped regions being spaced apart from the inner edges of the shallow trench isolation throughout the entire volume of the active region by portions of the active region that extend laterally from the outer edges of the second lightly-doped regions to the inner edges of the shallow trench isolation.

8. The high-voltage transistor of claim 1 wherein the outer edges of the second lightly doped regions are spaced apart from the inner edges of the shallow trench isolation by between about 100 nm and 500 nm.

9. The high-voltage transistor of claim 1 wherein the first conductivity type is p-type and the second conductivity type is n-type.

10. The high-voltage transistor of claim 1 wherein the second lightly-doped regions extend outwardly at the edges of the channel length from at least the drain region towards the inner edges of the shallow trench isolation, outer edges of the second lightly doped regions in the direction of the channel length being spaced apart from the inner edges of the shallow trench isolation throughout the entire volume of the active region by portions of the active region that extend laterally from the outer edges of the lightly-doped regions to the inner edges of the shallow trench isolation in the direction of the channel length.

11. A high-voltage transistor comprising:
   an active region including a p-type diffused region defined by inner edges of a border of shallow trench isolation;
   a gate having side edges and end edges disposed over and insulated from the active region;
   spaced apart n-type source and drain regions disposed in the active region outwardly with respect to the side edges of the gate;
   first lightly-doped n-type regions more lightly doped than the source and drain regions, the first lightly-doped regions extending inwardly between the source and drain regions towards the gate to define a channel under the gate;
   second n-type lightly-doped regions more lightly doped than the source and drain regions that extend outwardly from both the drain region towards the inner edges of the shallow trench isolation, outer edges of the second lightly doped regions being spaced apart from the inner edges of the shallow trench isolation throughout the entire volume of the active region of the active region by portions of the active region that extend laterally from the outer edges of the second lightly-doped regions to the inner edges of the shallow trench isolation.

12. The high-voltage transistor of claim 11 wherein the outer edges of the second lightly-doped regions are spaced apart from the inner edges of the shallow trench isolation by between about 100 nm and about 500 nm.

13. The high-voltage transistor of claim 11 further comprising:
   a salicide block layer disposed over the active region and extending at least to the inner edges of the shallow trench isolation, the salicide block layer having contact apertures formed therein extending to the source and drain regions and to the gate; and
   metal salicide layers formed in the contact apertures at the source and drain regions and the gate.

14. The high-voltage transistor of claim 13 wherein the salicide block layer extends over the shallow trench isolation.

15. The high-voltage transistor of claim 11 wherein the lightly doped regions are doped to a level of between about 5e16 and 5e17 cm-3.

16. The high-voltage transistor of claim 11 wherein the source and drain regions are doped to a level of between about 1e19 and 1e20 cm-3.

17. The high-voltage transistor of claim 11 wherein the lightly-second doped regions extend outwardly from both the source and drain regions towards all of the inner edges of the shallow trench isolation, outer edges of the second lightly doped regions being spaced apart from the inner edges of the shallow trench isolation throughout the entire volume of the active region by portions of the active region that extend laterally from the outer edges of the lightly-doped regions to the inner edges of the shallow trench isolation.

18. The high-voltage transistor of claim 11 wherein the outer edges of the second lightly doped regions are spaced apart from the inner edges of the shallow trench isolation by between about 100 nm and 500 nm.

19. The high-voltage transistor of claim 11 wherein the second lightly-doped regions extend outwardly at the edges of the channel length from at least the drain region towards the inner edges of the shallow trench isolation, outer edges of the second lightly doped regions in the direction of the channel length being spaced apart from the inner edges of the shallow trench isolation throughout the entire volume of the active region by portions of the active region that extend laterally from the outer edges of the lightly-doped regions to the inner edges of the shallow trench isolation in the direction of the channel length.

* * * * *